(12) United States Patent
Khitun et al.

US007528456B1

(10) Patent No.: US 7,528,456 B1
(45) Date of Patent: May 5, 2009

(54) NANO-SCALE COMPUTATIONAL ARCHITECTURES WITH SPIN WAVE BUS

(75) Inventors: Alexander Khitun, Los Angeles, CA (US); Roman P. Ostroumov, Los Angeles, CA (US); Kang L. Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 298 days.

(21) Appl. No.: 11/365,794

(22) Filed: Mar. 1, 2006

Related U.S. Application Data

(60) Provisional application No. 60/657,492, filed on Mar. 1, 2005.

(51) Int. Cl.
*H01L 45/02* (2006.01)
(52) U.S. Cl. .............................. 257/421; 257/E29.323; 257/E43.001; 977/933
(58) Field of Classification Search .................. 257/421, 257/E29.323, E43.001; 977/933
See application file for complete search history.

(56) References Cited

U.S. PATENT DOCUMENTS

| 6,774,391 | B1 * | 8/2004 | Cowburn ...................... 257/24 |
| 6,867,988 | B2 * | 3/2005 | Cowburn ...................... 257/24 |
| 7,212,026 | B2 * | 5/2007 | Bourianoff et al. ............. 326/7 |
| 2007/0259209 | A1 * | 11/2007 | Slavin et al. ............. 428/692.1 |
| 2007/0296516 | A1 * | 12/2007 | Eshaghian-Wilner et al. ........................... 333/101 |
| 2008/0231392 | A1 * | 9/2008 | Kim et al. .................... 333/147 |

FOREIGN PATENT DOCUMENTS

JP 2005181071 A * 7/2005

WO WO 2007037625 A1 * 4/2007

OTHER PUBLICATIONS

Kostylev et al., "Spin-wave logical gates", Appl. Phys. Lett. 87, 153501 (2005).*
Wu et al., "Self-Generation of Chaotic Solitary Spin Wave Pulses in Magnetic Film Active Feedback Rings", Phys. Rev. Lett. 95, 237202 (2005).*
Akhiezer, et al; "Spin Waves"; Physico-Technical Institute; 1968.
Bandyopadhyay, et al.; "Supercomputing With Spin-Polarized Single Electrons In A Quantum Coupled Architecture"; Nanotechnology 5; 1994; pp. 113-133.
Cirac, et al.; "Quantum Computations with Cold Trapped Ions"; Physical Review Letters; vol. 74; No. 20; 1995; pp. 4091-4094.
Covington, et al.; "Time-Resolved Measurement Of Propagating Spin Waves In Ferromagnetic Thin Films"; Physical Review Letters; vol. 89; No. 23; Dec. 2, 2002; pp. 237202-1-237202-4.
Giesse, et al.; "A Mössbauer Spectroscopy Study of Antiferromagnetic Iron Arachidate Langmuir—Blodgett Films"; International Conference on the Applications of the Mossbauer Effect: ICAME; Aug. 8-14, 1993; pp. 1415-1419.

(Continued)

*Primary Examiner*—Anh Phung
*Assistant Examiner*—Michael Lulis
(74) *Attorney, Agent, or Firm*—Ballard Spahr Andrews & Ingersoll, LLP

(57) ABSTRACT

New kinds of nano-scale computational architectures using spin waves as a physical mechanism for device interconnection are described. A method for operating a logic device having a spin wave bus includes the step of receiving an input signal representing information. A spin wave is excited with the information coded in an aspect of the spin wave in response to receiving the input signal. The spin wave is propagated through a spin wave bus having an associated polarization. The information associated with the spin wave is determined in response to propagating the spin wave through the spin wave bus.

19 Claims, 12 Drawing Sheets

OTHER PUBLICATIONS

Imamoglu, et al; "Quantum Information Processing Using Quantum Dot Spins and Cavity QED"; Physical Review Letters; vol. 83; No. 20; Nov. 15, 1999; pp. 4204-4207.

B. E. Kane; "A Silicon-Based Nuclear Spin Quantum Computer"; Nature; vol. 393; May 14, 1998; pp. 133-137.

Khitun, et al.; "Spin-Wave Utilization In A Quantum Computer"; Physical Review A; vol. 64; 2001; pp. 062304-1-062304-5.

V. V. Kostyuchenko; "Spin-Wave Fluctuations in a Quantum Computer Based on Spin-Polarized Electrons"; Russian Microelectronics; vol. 25; No. 5; 1996; pp. 327-329.

Kouwenhoven, et al.; "Quantum Dots"; Physics World; Jun. 1998; pp. 35-39.

Yi Ling; "Supersymmetric Spin Networks"; Journal of Mathematical Physics; vol. 43; No. 1; Jan. 2002; pp. 154-169.

Mani, et al.; "Nuclear Spin Based Memory And Logic In Quantum Hall Semiconductor Nanostructures For Quantum Computing Applications"; Physica E; vol. 12; No. 1-4; 2002; pp. 152-156.

Ohno, et al.; "Semiconductor Spin-Electronics"; JSAP International; No. 5; Jan. 2002; pp. 4-13.

Pradhan, et al.; "Quantum Computation by Optically Coupled Steady Atoms/Quantum-Dots Inside a Quantum Cavity"; 1999 Centennial Meeting Bulletin of the American Physical Society; vol. 44; No. 1; Part II; Mar. 20-26, 1999; pp. 1240.

John Preskill; "Reliable Quantum Computers"; Proc. R. Soc. London; Ser. A; 1998; pp. 385-410.

Roychowdhury, et al.; "Collective Computational Activity In Self-Assembled Arrays Of Quantum Dots: A Novel Neuromorphic Architecture For Nanoelectronics"; IEEE Transactions in Electron Devices; vol. 43; No. 10; Oct. 1996; pp. 1688-1699.

Saftic, et al; "Molecular Beam Epitaxy and Magnetic Properties of EuS Films on Silicon"; Journal of Magnetism and Magnetic Materials 28; 1982; pp. 305-312.

Sanvitoof; "Computational Spintronics At Molecular Level"; Irish Computer; vol. 28; No. 1; 2004; p. 16.

Silva, et al., "Inductive Measurement Of Ultrafast Magnetization Dynamics In Thin-Film Permalloy"; Journal of Applied Physics; vol. 85; No. 11; Jun. 1, 1999; pp. 7849-7862.

Sugahara et al.; "A Spin Metal-Oxide-Semiconductor Field-Effect Transistor Using Half-Metallic-Ferromagnet Contacts For The Source And Drain"; Applied Physics Letters; vol. 84; No. 13; Mar. 29, 2004; pp. 2307-2309.

Ventura, et al.; "Quantum Associative Memory"; Information Sciences 124; 2000; pp. 273-296.

Wiesendanger, et al; "Evidence for Selective Imaging of Different Magnetic Ions on the Atomic Scale by Using a Scanning Tunnelling Microscope With a Ferromagnetic Probe Tip"; Europhysics Letters; vol. 19; No. 2; 1992; pp. 141-146.

* cited by examiner

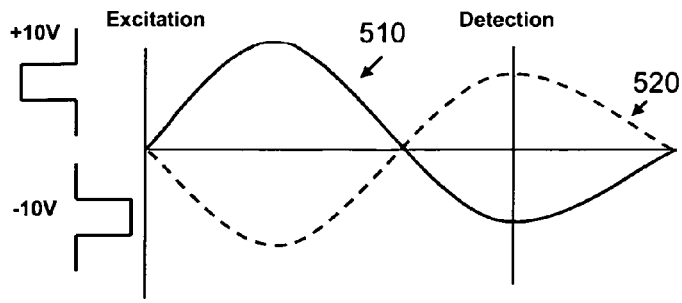

FIG. 5A

NOT

| Physical parameters | |
|---|---|
| Excitation pulse | Measured voltage |
| + 10 V | − 15mV |
| −10 V | + 15mV |

| Logic States $V_{ref} = 0\ V$ | |
|---|---|
| Input | Output |
| 1 | 0 |
| 0 | 1 |

AND

| Physical parameters | |
|---|---|
| Excitation pulses | Measured voltage |
| + 10 V  +10 V | + 27 mV |
| + 10 V  −10 V | 0 mV |
| − 10 V  +10 V | 0 mV |
| − 10 V  −10 V | −27 mV |

| Logic States $V_{ref} = 10m\ V$ | | |
|---|---|---|
| Input | | Output |
| 1 | 1 | 1 |
| 1 | 0 | 0 |
| 0 | 1 | 0 |
| 0 | 0 | 0 |

OR

| Physical parameters | |
|---|---|
| Excitation pulses | Measured voltage |
| + 10 V  +10 V | + 27 mV |
| + 10 V  −10 V | 0 mV |
| − 10 V  +10 V | 0 mV |
| − 10 V  −10 V | −27 mV |

| Logic States $V_{ref} = -10m\ V$ | | |
|---|---|---|
| Input | | Output |
| 1 | 1 | 1 |
| 1 | 0 | 1 |
| 0 | 1 | 1 |
| 0 | 0 | 0 |

NANO-SCALE COMPUTATIONAL ARCHITECTURES WITH SPIN WAVE BUS

CROSS REFERENCE TO RELATED APPLICATION

This application claims priority to a U.S. Provisional Patent Application with application No. 60/657,492 entitled "NANO-SCALE COMPUTER ARCHITECTURES WITH SPIN WAVE BUS," which was filed on Mar. 1, 2005. This application is hereby incorporated by reference in its entirety.

BACKGROUND

With the considerable technological advances, computing devices have become more common resulting in a sizable increase in use. To address this increased use, there has been a lingering quest to increase the speed and processing power of the transistor-based computational architecture. According to "Moore's law," computing power doubles every 18 months. However, it is widely believed in the semiconductor community that further enhancement of the most elaborate silicon transistor—CMOS is coming to the end. This end of scaling will be due to several concurrent fundamental and practical limits related to transistor operation and manufacturability. Fundamental limits include sustaining viable transistor operation and limiting thermal dissipation to manageable limits, both of which are common to all charge based logic devices and independent of device structure and material properties.

Utilizing electron spin for information encoding and information transmission creates somewhat a viable solution. Spintronics is a new approach to electronics, where the information is carried out by the spin of the carrier, in addition to the charge. In spin-based semiconductor logic devices, the carrier transport depends on the spin, not the charge, of the carrier. Generally, spintronic architectures operate according to the common scheme: (i) information is stored into the spins as a spin orientation (e.g., along with or opposite to the external magnetic field), (ii) the spins, being attached to carriers, transfer information from one spin-based device to another through a conducting wire, (iii) spin polarization of the transmitted carriers affects the conductance of the recipient device, and (iv) information is read at the output terminal. Although the performance of the spin-based devices might be advantageous, the use of charge transfer for information exchange between the devices significantly limits the performance of the spintronic architecture. Hence, there remains an unmet need in the art.

BRIEF DESCRIPTION OF DRAWINGS

FIG. 5A is a graph illustrating the excitation voltage and the detection voltage over time.

FIG. 5B illustrates tables showing physical parameters and truth tables for the three logic devices.

Figure 1A:
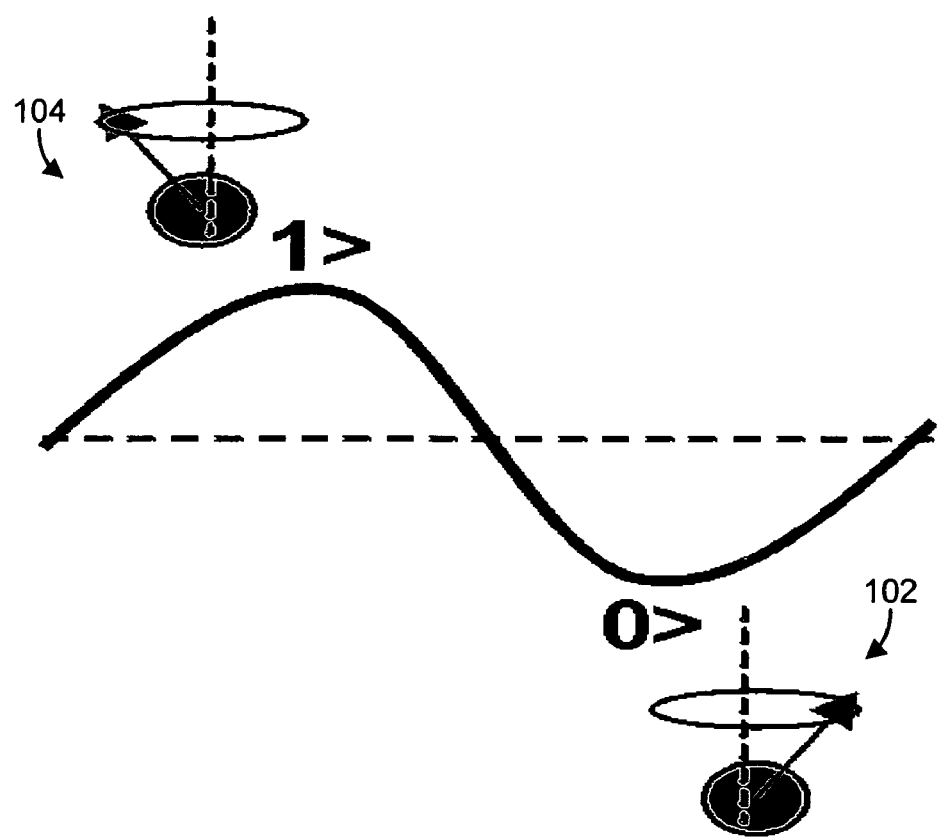
FIG. 1A is a graph illustrating logic states associated with different spins that are encoded in the phase of a signal.

While the invention is susceptible to various modifications and alternative forms, specific embodiments have been shown by way of example in the drawings and subsequently are described in detail. It should be understood, however, that the description herein of specific embodiments is not intended to limit the invention to the particular forms disclosed. In contrast, the intention is to cover all modifications, equivalents, and alternatives falling within the spirit and scope of the invention as defined by the appended claims.

DETAILED DESCRIPTION

The invented nano-scale computer architecture with spin wave bus system uses spin waves as a physical mechanism for information transmission among nano-scale devices. A spin wave is a collective oscillation of spins in an ordered spin lattice around the direction of magnetization and is similar to the lattice vibration, where atoms oscillate around their equilibrium position. A propagating spin wave changes the local polarization of spins in a ferromagnetic material (i.e., a material with high magnetic permeability). Examples of ferromagnetic materials include, but are not limited to, iron, nickel, cobalt, and the like. In turn, the changing magnetic field results in an inductive voltage. According to Faraday's law, the magnitude of the inductive voltage is proportional to the speed of the magnetic flux change $$E_{ind} = -\frac{d\Phi_m}{dt}.$$

An inductive voltage signal on the order of several millivolts produced by spin waves can propagate through a nanometer thin ferromagnetic film for distances up to 50 microns at room temperature. The novel nano-scale architectures use spin waves for coding information into the phase, rather than in the amplitude of the signal. Turning now to FIG. 1A, this figure is a graph illustrating logic states associated with different spins that are encoded in the phase of a signal. For example, the logic state |0> is associated with spin 102, and the logic state |1> is associated with the spin 104. Additional details regarding these are architectures are described herein.

Figure 1B:
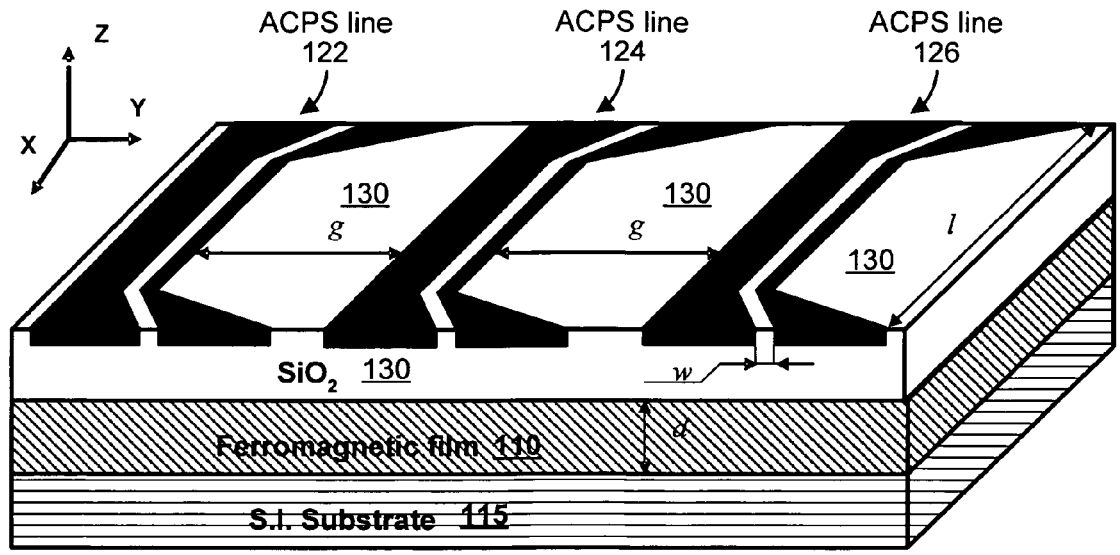
FIG. 1B is a perspective view of a novel logic device that includes a spin wave bus made of three transmission lines.

Turning now to FIG. 1B, this is a perspective view of a novel logic device 100 that includes a spin wave bus and three high-frequency transmission lines serving as input/output ports, which are subsequently described. A transmission line is an example of an electronic device suitable for spin wave excitation/detection. Transmission line configuration can be adjusted to meet the impedance match with outer electronic circuits. Though the logic device 100 is shown with three transmission lines, the number of transmission lines can be 1, 5, 9, or some other suitable number. The structure of the logic device 100 includes a ferromagnetic film layer 110 adjacent to a semi-isolating substrate 115. In one implementation, the ferromagnetic film 110 can be grown on top of the semi-isolating substrate 115. The polarization direction associated with this film can be along the X-axis as shown in FIG. 1B, though other polarization directions can be chosen. In addition, the thickness of the ferromagnetic film 110 (labeled as d in FIG. 1B) can be 10 nm, 30 nm, 70 nm, or some other suitable thickness on the order of several tens of nanometers.

The ferromagnetic film 110 can be composed nickel-iron, as well as a variety of other ferromagnetic and anti-ferromagnetic films. Examples of different of applicable anti-magnetic and ferromagnetic films can include, but are not limited to, metal silicides, such as iron disilicide ($FeSi_2$). Because metal silicides can be epitaxially grown on a silicon substrate, they can be easily incorporated in the novel nano-scale computer architecture with a spin wave bus. Using metal silicides can be particularly useful for integration with conventional silicon-based VLSI (very large scale integration) circuits. A semi-isolating substrate 115 is a substrate that is made of a semiconductor material (e.g., silicon). In addition, the thickness of this substrate can be 0.001 mm, 0.11 mm, 1 mm, or some other suitable thickness.

As mentioned above, the logic device 100 includes three asymmetric coplanar strip (ACPS) transmission lines labeled ACPS line 122, ACPS line 124, and ACPS line 126. Though shown as asymmetric lines, an alternative embodiment can result by using symmetric planar lines or some other suitable variant serving as a micro antenna. The dimensions of the ACPS lines 122-124 can be defined by the frequency of the transmitting signal. To separate these lines from the ferromagnetic film 110, the logic device 100 includes an insulator 130. This insulator layer 130 can be formed from silicon dioxide, or some other suitable insulator. In addition, the thickness of the insulator layer 130 can be 10 nm, 100 nm, 300 nm, 500 mm, or some other suitable thickness.

Figure 1C:
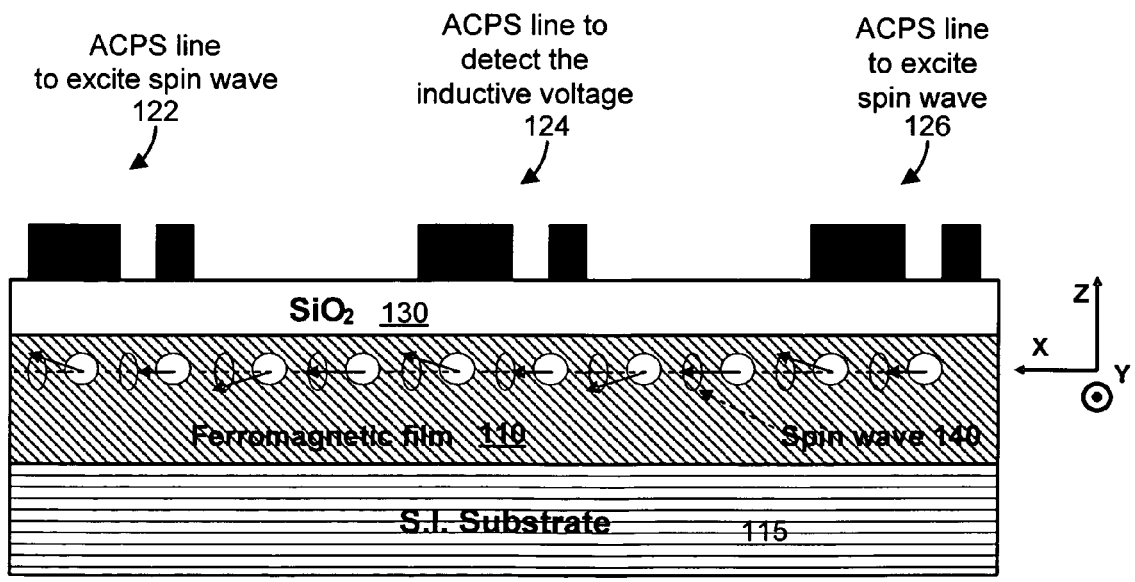
FIG. 1C is a cross-sectional view of the logic device of FIG. 1B illustrating the creation, propagation, and detection of spin waves in the ferromagnetic film of FIG. 1B.

Turning now to FIG. 1C, this figure is a cross-sectional view of the logic device 100 illustrating the creation, propagation, and detection of spin waves in the ferromagnetic film 110. Each of the ACPS lines 122-124 can be used for spin wave excitation (i.e., as an input device) and detection (i.e., as an output device). To create a spin wave, a voltage pulse is applied to any one of these ACPS lines, which produces a magnetic field perpendicular to the ferromagnetic film's polarization direction and generates a spin wave 140, or spin wave packet. Once the spin wave is generated, it propagates through the ferromagnetic film 110 along the Y-axis. The arrows indicate the spin orientation in the lattice, though this direction can be changed. For example, the ACPS line 122 can excite the spin wave 140 that propagates through the ferromagnetic film 110. In contrast, the ACPS line 124 can detect the propagating spin wave 140. In an alternative implementation, the ACPS line 122 can excite one spin wave, while the ACPS line 126 excites another spin wave. In this embodiment, the output on the ACPS line 124 is a superposition of the two waves. Depending on the relative phase of the spin waves, the amplitude of the inductive voltage on ACPS line 124 can be enhanced (two waves are in phase) or decreased (two waves are out of phase).

Figure 2A:
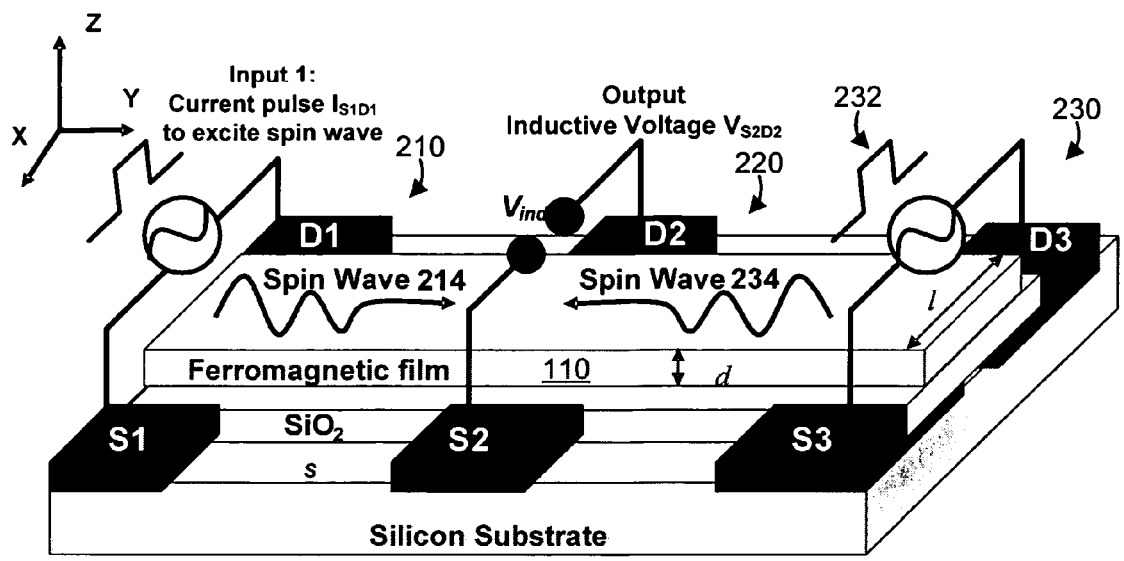
FIG. 2A is a perspective view illustrating a sophisticated logic device that includes three spin-based Field Effect Transistors (FETs).
Figure 2B:
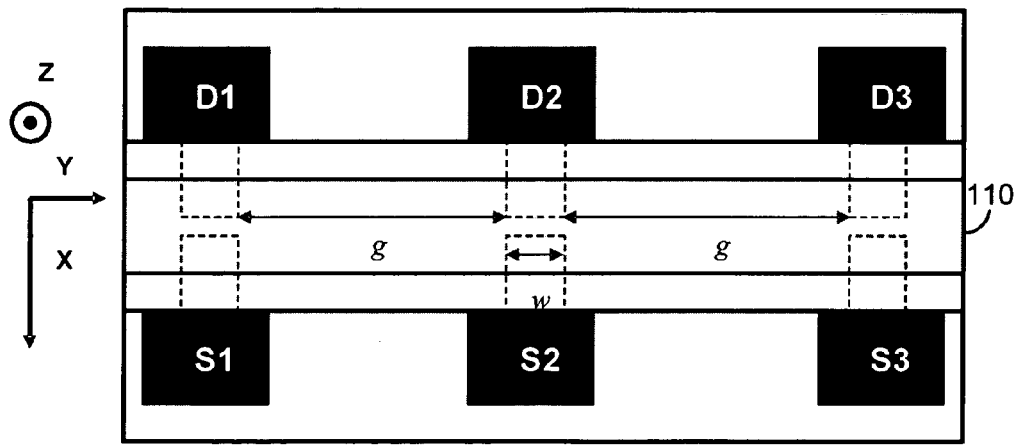
FIG. 2B is a top view of the logic circuit of FIG. 2A illustrating how the transistors can be placed an equal distant g apart.
Figure 2C:
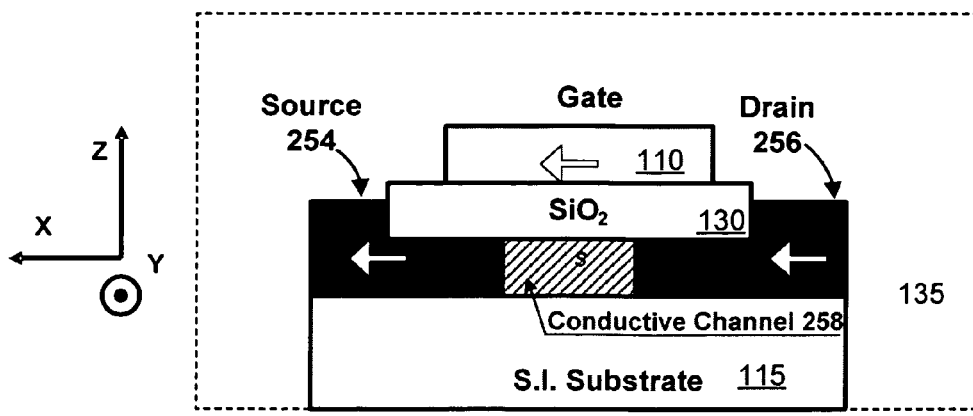
FIG. 2C is a cross-sectional view for any one of the FETS of FIG. 2B.

FIG. 2A is a perspective view illustrating a sophisticated logic device 200 that includes three spin-based Field Effect Transistors (FETs) labeled transistor 210, transistor 220, and transistor 230. Spin FET is another example of an electronic device suitable for spin wave excitation/detection. FIG. 2B is a top view of this logic circuit illustrating how the transistors can be placed an equal distant g apart where g is 10 nm, 20 nm, 10 μm, or some other suitable distance. The source and drain contacts for these transistors are labeled S1, S2, S3, and D1, D2, D3, respectively. The contacts can be formed from a half-metal, which facilitates providing spin-polarized injection/detection. Some half-metals that can be used include, but are not limited to, Fe, Co, $CrO_2$, or any other half-metal. The gates for the FETs 210-230 are formed using the ferromagnetic film 110, which provides a common gate for these transistors. While three transistors are shown with a common gate, an alternative embodiment can exist where the number of transistors with common gates can be two, four, or some other suitable number. The source, the drain and the gate for the FET 210, FET 220, and FET 230 are polarized in the same direction. FIG. 2C is a cross-sectional view for any one of the FETS (e.g., FET 210, FET 220, or FET 230). From this view, the oxide layer 130 separates the gate 110 from the source S and the drain D. This view includes the source 252, drain 254, oxide layer 130, and substrate 115 and the conductive channel 258. A conductive channel is a medium through which charge carriers can flow, for example p-doped or n-doped silicon.

Like the ACPS transmission lines 122-126, the spin-based FETs 210-230 can be used as an input device or as an output device. When used as an input device, a current pulse that is applied between the source and the drain generates a corresponding spin wave. As mentioned above with regard to these ACPS transmission lines, applying an input pulse to two transmission lines results in a superposition of spin waves to on an output transmission line. Similarly, applying an input pulse 212 between the source $S_1$ and drain $D_1$ of the FET 210 and an input pulse 232 between the source $S_3$ and drain $D_3$ of the FET 210 generates spin wave 214 and spin wave 234 respectively, which propagate throughout the ferromagnetic layer 110. As these spin waves reach the gate area of the FET 220, they alter the spin polarization of the gate, which correspondingly affects the conductance between the source $S_2$ and the drain $D_2$, which affects the voltage across FET 220. Large disturbances of the spin polarization lower the conductance of the output spin-based FET 220. The magnetic field produced by the spin waves as they propagate within the ferromagnetic film 110 can control the output conductance between the source $S_2$ and the drain $D_2$. While the FET 210 and the FET 230 are used in the above example as input devices and the FET 220 as an output device, numerous embodiments can result by varying the roles of these FETs.

Exciting a Spin Wave Using a Single Input Device

As spin waves are excited at either FET 210 or FET 230, their propagation can be described using the Landau-Lifshitz's equation as follows:

$$\frac{d\vec{m}}{dt} = -\frac{\gamma}{1+\alpha^2}\vec{m} \times \left[\vec{H}_{eff} + \alpha\vec{m} \times \vec{H}_{eff}\right] \quad (1)$$

where $$\vec{m} = \frac{\vec{M}}{M_s}$$

is the unit magnetization vector, $M_s$ is the saturation magnetization, $\gamma$ is the gyro-magnetic ratio, and $\alpha$ is the phenomenological Gilbert damping coefficient. The first term in the bracket in equation (1) describes the precession of magnetization about the effective field and the second term describes its dissipation. $\vec{H}_{eff}$ is the effective field that consists of the superposition of the external field and contributions from anisotropy, and exchange fields:

$$\vec{H}_{eff} = -\nabla^2\Phi + \frac{2A}{M_s}\nabla^2\vec{m} + \frac{2K}{M_s}(\vec{m}\cdot\vec{e})\vec{e} + \vec{H}_{pulse} \quad (2)$$

where $\nabla^2\Phi = 4\pi M_s \nabla V \cdot \vec{m}$, A is the exchange constant, K is the uniaxial anisotropy constant, e is the unit vector along with the uniaxial direction, and $\vec{H}_{pulse}$ is the pulse field produced by the source-drain current. The first three terms in the Eq. (2) are defined by the material properties of the ferromagnetic sample, such as the saturation magnetization, the exchange constant, and the uniaxial constant. The last term $\vec{H}_{pulse}$ is the excitation pulse, which can be artificially controlled. By adjusting the form of the excitation pulse, or external pulse, it is possible to excite a spin wave to any desired frequency and amplitude. For example, a short current pulse (e.g., <100 ps) through a conducting strip placed close (e.g., 54 μm) to the NiFe film excites a spin wave packet, which is as a linear superposition of individual spin waves.

The input device (e.g., ASPC line 122 or spin-FET 210) excites a spin wave packet with a Gaussian distribution of wave vectors. The wave packet propagates along the y direction, as shown in FIG. 2A, and can be described with one magnetization component $M_y$ as follows:

$$M_y = \frac{C\exp(-t/\tau)}{\delta^4 + \beta^2 t^2}\exp\left[\frac{-\delta^2(y-vt)^2}{4(\delta^4 + \beta^2 t^2)}\right] \times \cos(k_0 y - \omega t + \phi) \quad (3)$$

where C is a constant proportional to the amplitude, τ is the decay time, $\phi$ is the initial phase, $$v = \frac{\partial w}{\partial k}(k=k_0) \text{ and } \beta = \frac{1}{2}\frac{\partial^2 w}{\partial k^2}(k=k_0)$$

are the coefficients of the first and second order terms, respectively, in the Taylor expansion of the nonlinear dispersion, $\omega(k)$.

The dispersion relation for spin waves propagating orthogonally to the magnetization vector M is given by $$\omega = \gamma\{8\pi K + (2\pi M_s)^2[1 - \exp(-2kd)]\}^{1/2} \quad (4)$$

where d is the thickness of the film. When the ferromagnetic film 110 is composed of NiFe, the material characteristics are as follows: the exchange constant A=1.6×10$^{-6}$ erg/cm, the multiple of the saturation magnetization 4 $M_s$=10 kG, the multiple of the anisotropy constant 2K/$M_s$=4 Oe, the gyromagnetic ratio γ=19.91×10$^6$ rad/s Oe, and the Gilbert damping coefficient α=0.0097. The following fitting parameters are used τ=0.6 ns, $k_0$=0.25 μm$^{-1}$, and δ=5.7 μm for d=27 nm. As the composition of the ferromagnetic film changes, the material characteristics change.

Figure 3:
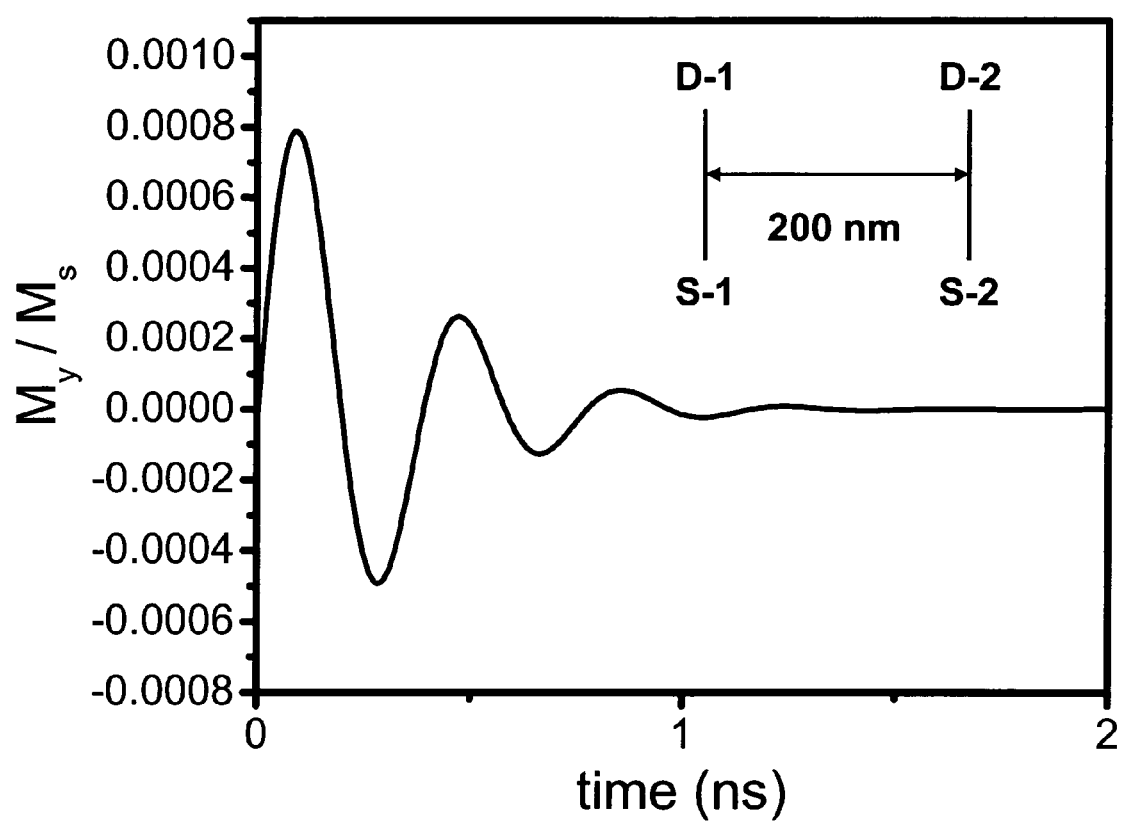
FIG. 3 is a graph illustrating the change of spin polarization as a function of time caused by a spin wave packet that is excited by a single input device.

FIG. 3 is a graph illustrating the change of spin polarization as a function of time caused by a spin wave packet that is excited by a single input device, such as ACSP line 122 or FET 210. The distance between the excitation point and the point of observation can 1 μm, 0.5 μm, 2 μm, or some other suitable distance. The spin waves produce perturbation in spin orientation that is perpendicular to the direction of magnetization $M_y$. The amplitude is much less than the saturation magnetization (i.e., $$\frac{|M_y|}{M_s} \ll 1.$$

Exciting a Spin Wave Using Two Input Devices

Spin-FET 210 and spin-FET 230, like the ACPS line 122 and ACPS line 126 can produce a combined effect when operating as two input devices. Each of the input devices generates a spin wave packet described by the Equation 3 (see above). The amplitudes of the input signals are the same, while the relative phase between the input signals can be controlled, for example, by the polarity of the applied current pulses. Since the current pulses having the same polarity can produce local magnetic fields oriented in the same direction, the spin wave packets have the same initial phase $\phi_1=\phi_2$, where $\phi_1$ is the phase of one packet and $\phi_2$ is the phase of the other packet.

In an alternative embodiment, the current pulses can have different polarities. In this case, the produced spin wave packets have an initial phase difference characterized by $\phi_1-\phi_2=\pi$. To find the magnetization change caused by two out of phase spin wave packets, the resultant magnetization is calculated as a superposition of waves of the same frequency from each packet as follows:

$$\overline{M}_y = \frac{1}{w}\int_{-w/2}^{w/2}\int_{\omega}[M_{1y}^2(\omega) + M_{2y}^2(\omega) + 2M_{1y}(\omega)M_{2y}(\omega)\cos(\phi_1-\phi_2)]d\omega dy \quad (5)$$

where w is the width of the detecting device along with the Y-axis (See the gap between the strips in FIG. 1B or the spin-FET gate width in FIG. 2B. The subscripts depict the magnetization components of the first and the second packets, respectively. The integration is made over a finite length w=200 nm to take into account the effect of dephasing. In an alternative embodiment, w can be 100 nm, 300 nm, or some other suitable number. The, inductive voltage is calculated according to the following equation:

$$V_{ind} = \left(\frac{\mu_0 l d f(z, w)}{4}\right)\left(\frac{Z}{Z + 0.5 R_{dc}}\right)\frac{d\overline{M}_y}{dt} \quad (6)$$

where $\mu_0$ is the magnetic constant, l is the length of the sample (see FIG. 1B) or the channel length (see FIG. 2A) and l=50 μm, f (z, w) is the spacing loss function, Z is the strip line resistance, and $R_{dc}$ is the total ACPS line DC resistance. In an alternative embodiment, l can be 40 μm, 60 μm, or some other suitable number that is on the order of tens of microns.

Figure 4:
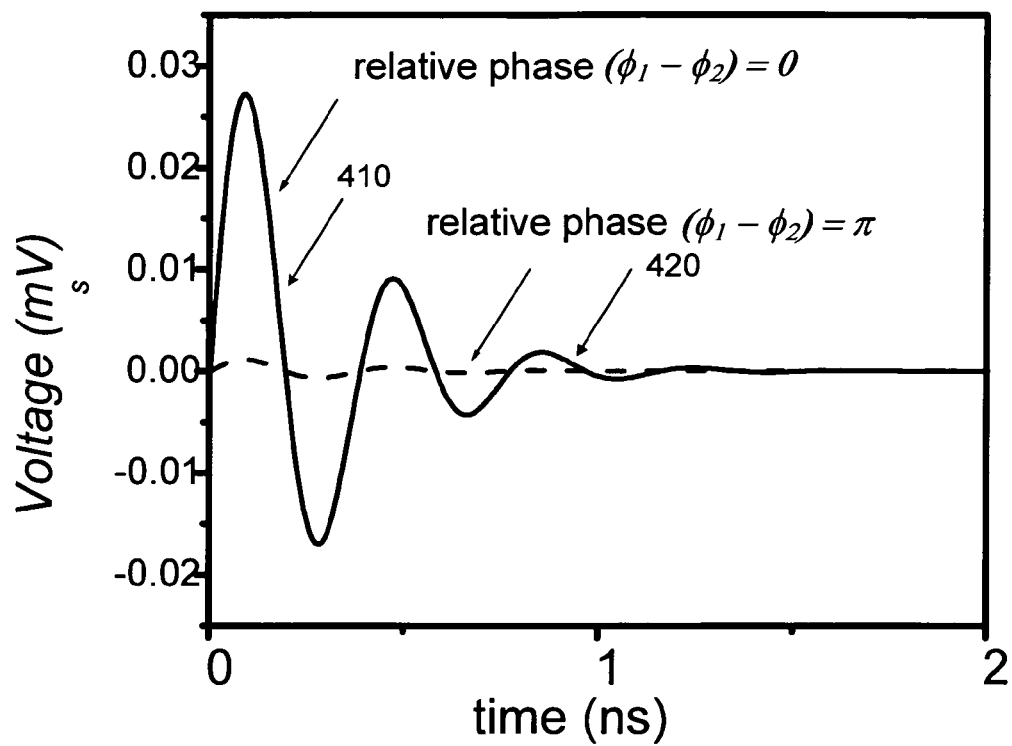
FIG. 4 is a graph illustrating the inductive voltage as a function of time both when the packets are in phase and when the packets are out of phase.

FIG. 4 is a graph illustrating the inductive voltage as a function of time both when the packets are in phase and when the packets are out of phase. The solid line 410 is the inductive voltage as a function of time when the spin wave packets are excited in phase. In contrast, the dashed line 420 is the inductive voltage as a function of time when the spin wave packets are excited out of phase. The illustrated inductive voltages depict the two potential outputs for the logic device 100, which can be formed from either ACPS transmissions lines as shown in FIG. 1B or as spin-FETS as shown in FIG. 1C. As illustrated from the graph in FIG. 4, the amplitude of the inductive voltage is at a maximum when the spin wave packets are excited in phase. When excited out of phase, the waves from the two input devices compensate for each other and the amplitude of the inductive voltage is much less. The dephasing caused by the finite size of the detecting device is negligible since the packet coherence length $$l_c = \frac{\Delta k}{k_0^2}$$

is much longer than the width w of the detection area. In other words, $$\frac{w}{l_c} \ll 1.$$

Using the inventions with FETs as described with reference to FIGS. 2A-2C can be different that utilizing it with the ACPS transmission lines described with reference to FIGS. 1A-1C. For the FETs implementation, the logic device 200 utilizes the effect of a local magnetic field produced by the spin waves on the conductance in the spin-polarized channel. The sensitivity of the spin-FET device (i.e., logic device 200) can be higher than one based on the ACPS lines (i.e., logic device 100). The source-drain current in the logic device 200 is affected by both, the inductive voltage, which is approximately $$\frac{d\overline{M}_y}{dt},$$

and the absolute value of gate polarization, which is approximately $\overline{M}_y^2$. This/offers an additional degree of freedom to maximize the effect produced by the spin waves.

Operation of the Logic Device with Spin Wave Bus

For either the logic device 100 or the logic device 200, operation begins when an input voltage signal is received. As mentioned above, there can be multiple input voltage signals when there are multiple input devices. These input voltage signals are described in greater detail with reference to FIGS. 5A-5B. Receiving input signals affects the polarization in the ferromagnetic film 110, which creates the spin waves. Once generated, the spin waves propagate in the ferromagnetic film 110. This can result in a superposition of the wave packets that can be detected.

Figure 5C:
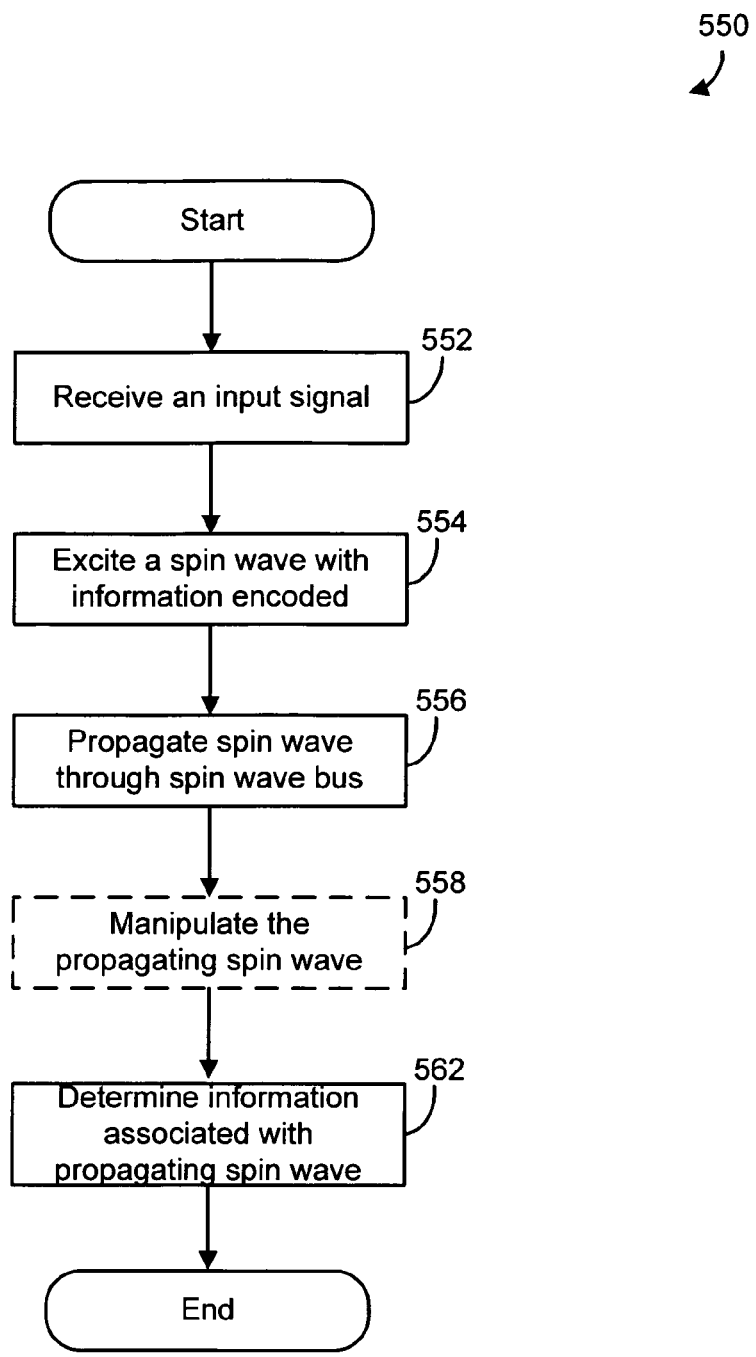
FIG. 5C is a flow chart illustrating a method of operating a logic device with a spin wave bus.

Turning now to FIG. 5C, this figure is a flow chart 550 illustrating a method for operating a logic device with a spin wave bus. This method can be used with the logic device 100, logic device 200, or some other suitable logic device having a spin wave bus. Any process descriptions or blocks in the flowchart can be understood as representing modules, segments, or portions of code, which can include one or more executable instructions for implementing specific logical functions or blocks in the process. Alternative implementations are included within the scope of the invention in which functions can be executed out of order from that shown or discussed, including substantially concurrently or in reverse order, depending on the functionality involved, as can be understood by those reasonably skilled in the art.

The method begins at block 552 where an input signal is received. This input signal can be a voltage pulse, optical pulse, electromagnetic wave, local magnetic field pulse, or some other suitable input signal that is produced by an appropriate device or media. In an alternative embodiment, block 552 can include receiving more than one input signal. Additional details regarding the input signal used with logic device 100 or logic device 200 are described with reference to FIGS. 1B-1C and FIGS. 2A-2C, respectively. Block 552 is followed by block 554 where a spin wave is excited with information encoded in an aspect of the spin wave. Aspects of a spin wave include its amplitude and phase. Information, such as logic states, can be coded in either the amplitude or the phase (see FIG. 1A) of an associated spin wave.

Block 554 is followed by block 556. In this block, the excited spin wave propagates through a spin wave bus. The spin wave bus can be a ferromagnetic layer/wire, an antiferromagnetic layer/wire, or the like. Additional detail regarding the composition of the spin wave bus is described herein. As the spin wave propagates along the spin wave bus, the polarization in the bus changes. For example, a polarization associated with a ferromagnetic layer (i.e., spin wave bus) changes as an excited spin wave propagates through the ferromagnetic layer. The correlation between changing polarization and changing magnetization is also described herein.

Block 556 is followed by an optional block 558. When this block is included, the propagating spin wave can be manipulated. The propagating spin wave results from the excited spin wave propagating through the spin wave bus. Manipulating the propagating spin wave can include superposing spin waves. As described with reference to block 552, more than one input signal can be received. Consequently, manipulating the propagating spin wave can include superposing input signals. Alternatively, manipulating the propagating spin wave can include changing an aspect of the spin wave, such as the phase or amplitude of the spin wave.

When block 558 is included, this block is followed by block 562. In block 562, information associated with the propagating spin wave is determined. As previously mentioned with reference to block 554, information can be encoded in an aspect of the excited spin wave. This encoded information remains associated with the propagating spin wave, which is determined in block 562. Determining, or reading out, this information can be done by assessing change in magnetization associated with the propagating spin wave.

In an alternative embodiment, the magnetization change in several spin waves can also be assessed. After block 558, the flow chart 550 ends.

Forming Logic Devices Using Spin Waves

The logic devices 100, 200 use spin waves to perform different logic functions in one device by controlling the initial phases of the waves. The set of logic gates (i.e., the two-bit gates, AND, OR, and the one-bit NOT) can be realized using the logic device 100 (see FIG. 1B) or the logic device 200 (see FIG. 2A). For example, the ACPS line 122 and ACPS line 126 shown in FIG. 1B function as input terminals, while ACPS line 124 functions as the output terminal. The input logic information is coded into the phase of the input voltage signal (i.e., voltage pulse) applied to the edge ASPC lines (i.e., ACPS line 122 and ACPS line 126). For example, $V_{input}=+10V$ can correspond to the logic state 1. In contrast, $V_{input}=-10V$ can correspond to the logic state 0. To detect the output voltage signal $V_{ind}$, a time-resolved inductive voltage measurement is used. This measurement is made during a short period of time $\tau(\Box 10\ ps)$ at some moment of time $t_m(\sim ns)$, which depends on the logic functions desired. To recognize the output logic state, a reference voltage $V_{ref}$ is introduced. If $V_{ind} > V_{ref}$, the output logic state 1 is assigned. Otherwise, the output logic state 0 is assigned. This is more clearly seen in FIG. 5A, which is a graph illustrating the excitation voltage and the detection voltage over time. A one-bit NOT gate, or inverter, can be achieved by measuring the inductive voltage produced by a spin wave excited at one of the input terminals (e.g., ACPS line 122 shown in FIG. 1B). When $$t_m = \frac{\pi g}{v_{ph}},$$

where g is the distance between the contacts, $v_{ph}$ is the spin wave phase velocity at $k_0$, and $V_{ref}=0V$, the desired logic correlation is achieved. Though the logic device 100 can include two input terminals corresponding to ACPS line 122 and ACPS line 126, one terminal is not used when the logic device 100 is functioning as a one-bit inverter.

In addition to being used as an inverter, the logic devices 100, 200 can also function as a two-bit AND gate. To accomplish this, the following values can be assigned:

$$t_m = \frac{2\pi g}{v_{ph}}$$

and $V_{ref}=5$ mV. The input terminals are placed an equidistant g from the output terminal (see FIG. 1B and FIG. 2B). Because a two-bit AND gate has two input terminals, the input signals can be received on both ACPS line 122 and ACPS line 126. In an alternative embodiment, FET 210 and FET 230 can be used as input devices. As shown in FIG. 4, the two spin wave packets that are excited in phase enhance the amplitude of the produced inductive voltage, and cancel each other when excited out of phase. Because detecting an ACPS line provides a continuous signal, a reference voltage signal is used to recognize logic state in the binary form 0 or 1. FIG. 5B illustrates tables showing physical parameters (i.e., input voltage versus output voltage) and truth tables for the three logic devices (i.e., NOT gate, AND gate, OR gate).

Finally, the logic devices 100, 200 can be configured as a 2-bit OR gate. The OR gate can be realized by assigning the following values:

$$t_m = \frac{2\pi g}{v_{ph}}$$

and $V_{ref}=-5$ mV. The only criterion that is changed between creating a two-bit AND gate and a two-bit OR gate is the sign of the reference voltage, which further illustrates the ease in converting the novel logic devices 100, 200 to any one of the previously described gates.

Architectures with a Spin Wave Bus

Figure 6:
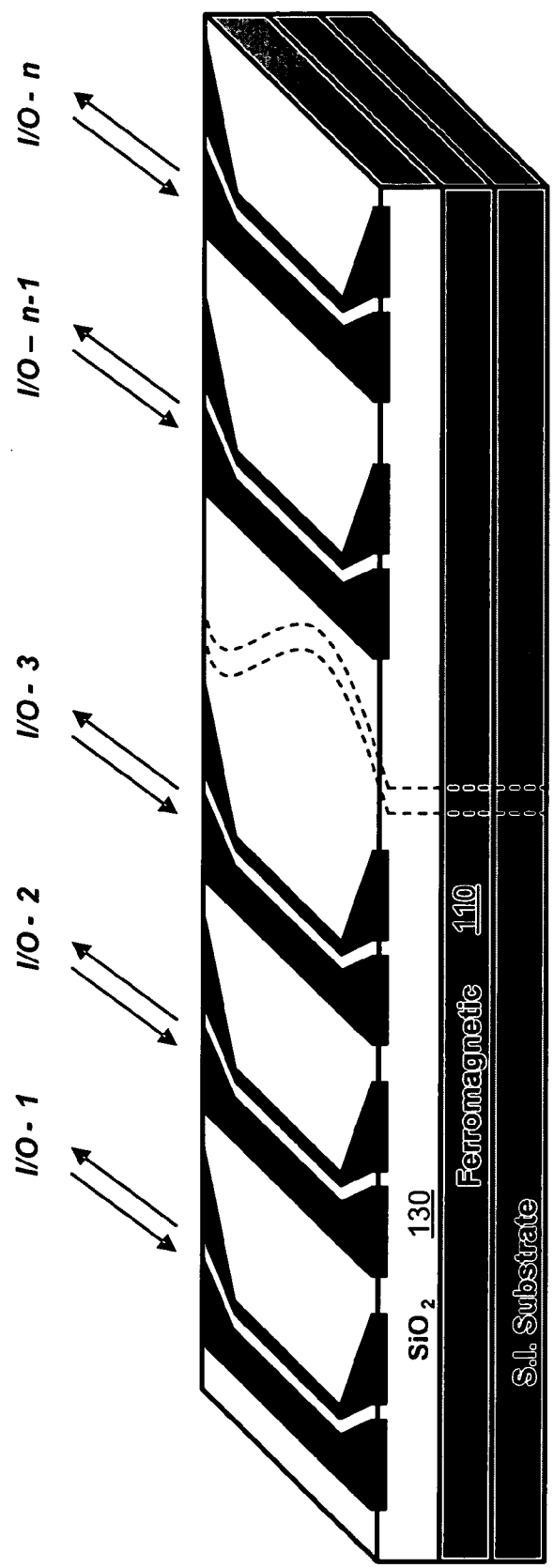
FIG. 6 is a perspective view of a novel computational architecture 600 that uses a spin wave bus with ACPS lines.

FIG. 6 is a perspective view of a novel computational architecture 600 that uses a spin wave bus with ACPS lines. The computational architecture 600 has numerous ACPS lines (e.g., I/O-1, I/O-2 . . . I/O-n) placed above the ferromagnetic film 110 but adjacent to the oxide layer 130. Despite the numerous lines, the computational architecture 600 operates similar to the logic device 100 and that description is not repeated here. Each of these ACPS lines can serve as a one bit input/output port. Hence, it is possible to build a multi-bit processor with a large number of ports, which facilitates simultaneous calculations of a number of different logic functions. One spin wave packet excited by one terminal can be superposed with many packets generated by the nearby terminals, which enables multi-bit majority logic gates. Majority logic is a way of implementing digital operations based on the principle of majority decision. The logic element, a majority gate, has an odd number of binary inputs and a binary output; the gate symbol and logic operation for a three-input majority gate are shown in FIG. 1B. The output is a logical 1 when the majority of the inputs are logical 1 and a logical 0 when the majority of inputs are a logical 0. Any digital function can be implemented by a combination of majority gates and binary inverters. Majority logic is a concise implementation of most digital functions encountered in logic-design applications.

The length of interaction $l_r$, which is the number of bits processed one time at each terminal, is limited by the spin wave attenuation. By estimate $l_r \approx \tau \cdot v_{ph}$, the length of interaction can be as high as tens of microns. The output of terminal I/O-i in FIG. 6 can be expressed as follows:

$$V_{ind}^i = \chi \frac{d}{dt} \sum_j (\Delta \sin(\omega t + \phi_j)) \exp[-r_{ij}/\tau v_{ph}] \quad (7)$$

where $\chi$ is a constant defined by the material properties and geometric factors, $\Delta$ is the amplitude of the spin wave, $r_{ij}$ is the distance between the terminals, and $\phi_j$ is the initial phase of the spin wave coming from input terminal I/O-j.

The most intriguing advantages of this architecture are its relative simplicity; scalability; and ability of high frequency (THz) operation. Simplicity refers to a prototype multi-functional logic device consisting of three ACPS lines, a ferromagnetic film, and an insulator layer, which is considerably less complex than a logic circuit that uses four Complementary Metal Oxide Semiconductors each to accomplish the same function. Scalability refers to the distance between the I/O ports is scalable to nanometers. High Frequency Operation: spin waves propagating in ferromagnetic film are suitable for high frequency signal transmission (e.g., 10 THz). The highest possible frequency depends on the material.

Figure 7:
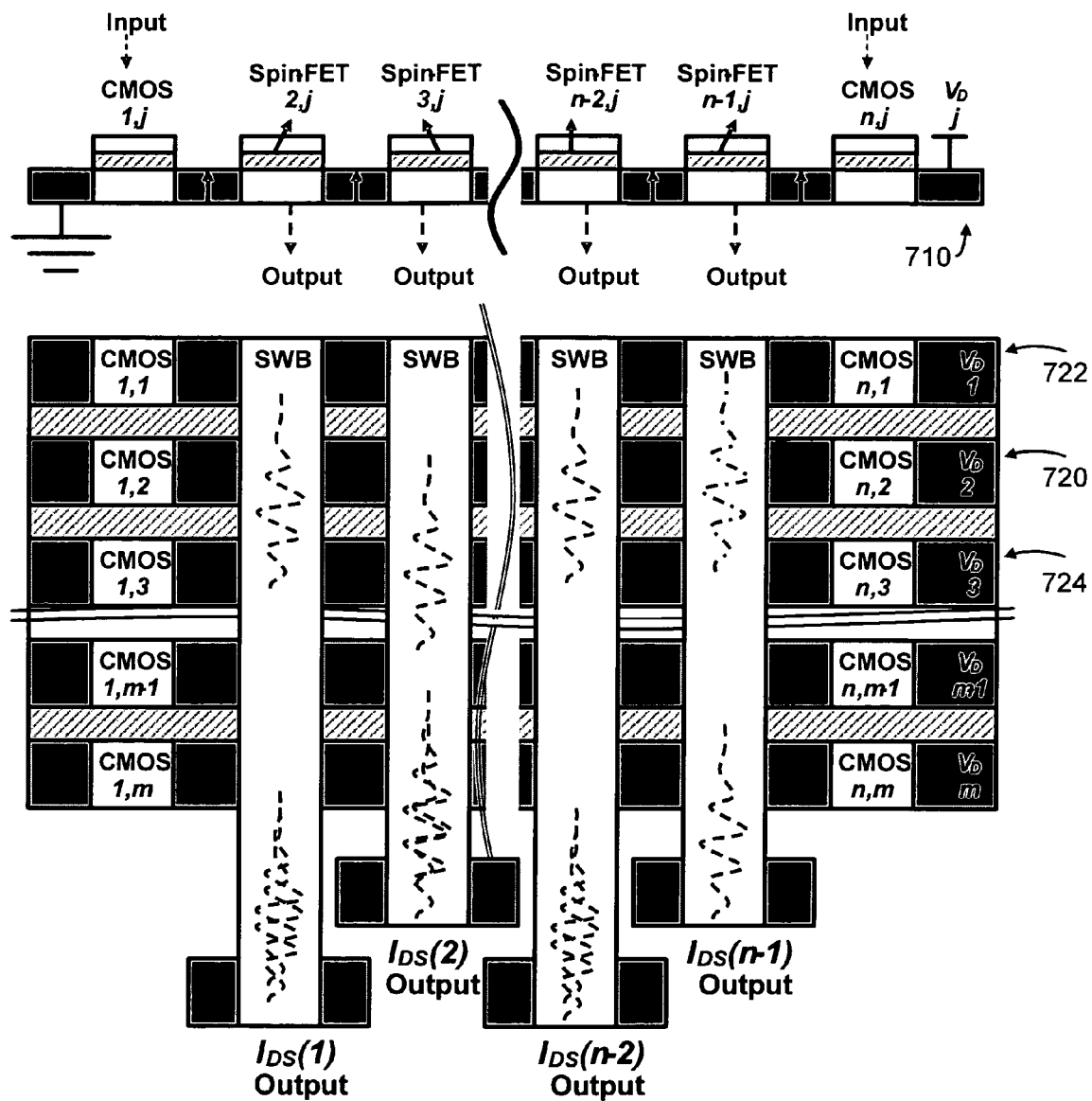
FIG. 7 is a block diagram illustrating another novel computer architecture that includes a spin wave bus with spin-FETS, which were describe with reference to FIGS. 2A-2C.

FIG. 7 illustrates another novel computer architecture 700 that includes a spin wave bus with spin-FETS, which were describe with reference to FIGS. 2A-2C. This computer architecture includes a 2-D array of spin-FETs united by the common ferromagnetic gates. Each row, such as row 710, includes a pair of complementary metal oxide semiconductor transistors (CMOSs), such as $CMOS_{1,j}$ that receive input signals. In addition, each row includes numerous spin-FETs (e.g., $Spin-FET_{2j}$, $Spin-FET_{3j}$, $Spin-FET_{n-1,j}$) connected in series with a common gate, as described with reference to FIG. 2A. Each row is biased by the potential $V_{dj}$. The current through each row is controlled by the gate voltage applied to the edge CMOSs. These row currents define the amplitudes and the phases of the spin waves excited by the spin-FETs in the column ferromagnetic films. A spin wave excited by spin-FETs in one row, such as row 720, propagates through the ferromagnetic film 130 and affects the conductance of spin-FETs in the nearest rows, such as row 722 and row 724.

The computer architecture 700 maintains all the advantages of the computer architecture 600, while including additional advantages. That is, logic functionality is achieved by manipulating the input voltage pulses. When the input voltage pulse creates current through ACPS, the currents create a magnetic field that excites spin waves, which varies the spin wave phases, for each row. In addition, the computer architecture 700 can have a substantial advantage over the computer architecture 600 because it amplifies the spin wave signal. This amplification is helpful because it can potentially minimize the energy needed to excite spin waves. Moreover, the interaction between spin-FETs via the spin waves in a common gate (e.g., a ferro-magnetic film) possesses a feedback loop, which is an important condition for enhancing logic functionality. The output signal detected by the column spin-FETs in FIG. 7 can be described as follows:

$$I_{SDj} = \Gamma \sum_j \Delta_{ij}(I_{SD_i})\sin(\omega t + \phi_i)\exp[-r_{ij}/\tau v_{ph}] \qquad (8)$$

where $\Gamma$ is the spin-FET amplification coefficient, and $\Delta_{ij}$ is the amplitude of the spin wave excited by each spin-FET in the column.

Figure 8A:
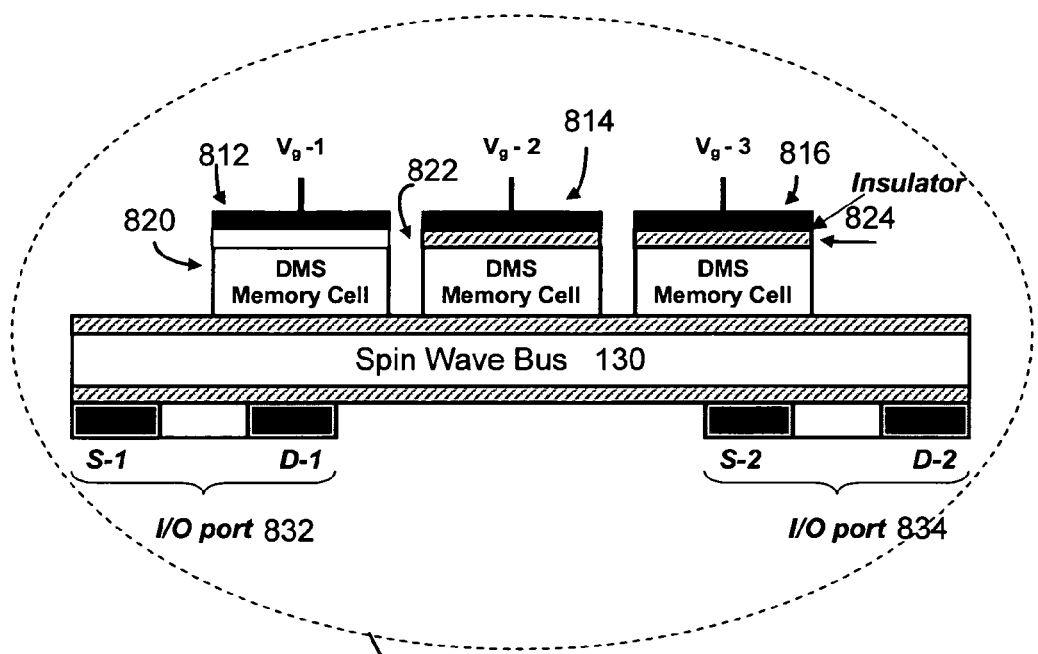
FIG. 8A is a block diagram illustrating a single DMS cluster that includes three memory cells.
Figure 8C:
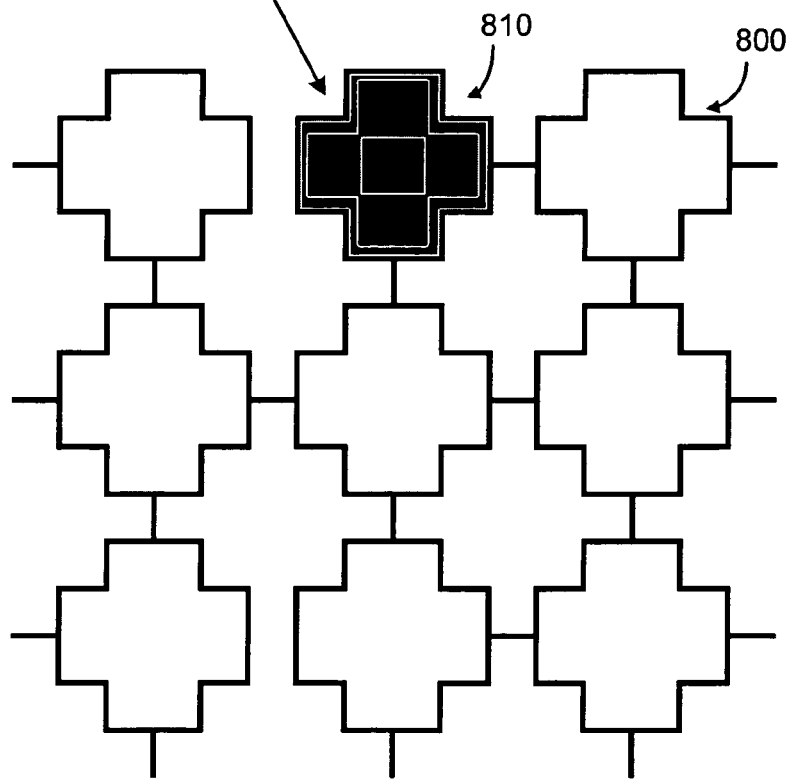
FIG. 8C is a block diagram illustrating a cellular nonlinear network that includes the DMS cluster of FIG. 8A.
Figure 8B:
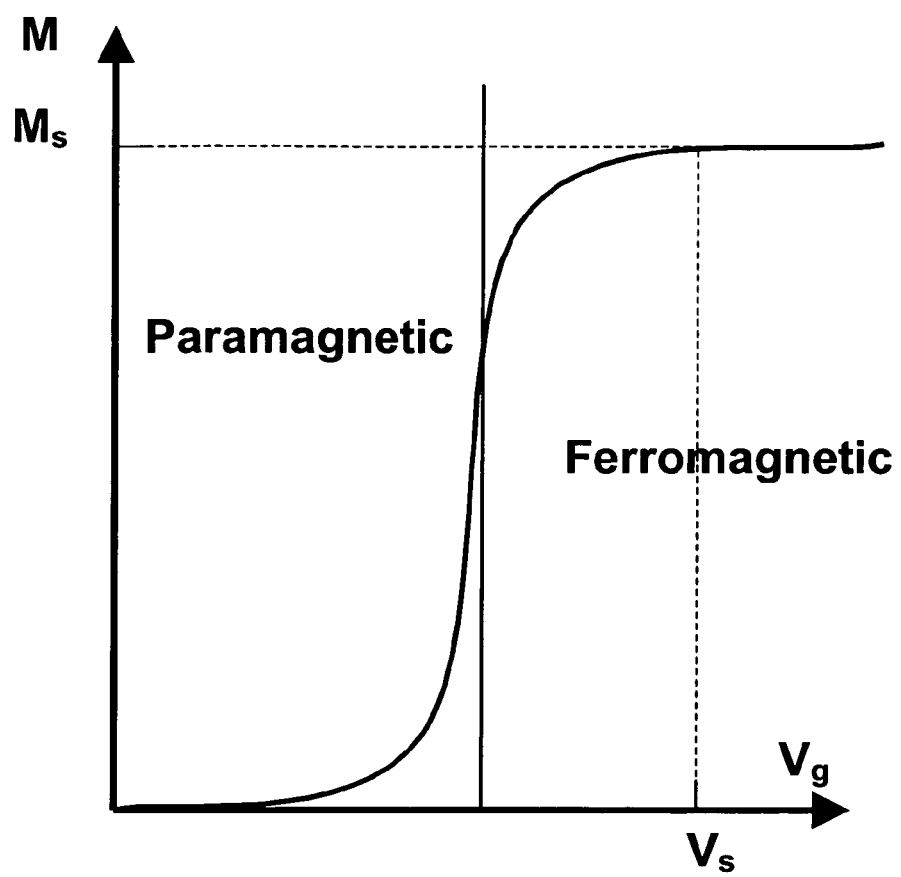
FIG. 8B is a graph illustrating the variation in magnetization for increasing voltage.

In another alternative embodiment, computer architecture 800 is formed by combining diluted magnetic semiconductor (DMS) structures, such as Ga(1-x)Mn(x) As, for example with a spin wave bus (see FIGS. 8A-8B). More specifically, the effect of hole-mediated ferromagnetism in DMS offers new possibilities in building magnetic memory based on phase transition. The injection of holes in a DMS structure at some critical density causes paramagnetic-ferromagnetic phase transition. Being in a ferromagnetic phase, the DMS cluster is suitable for spin polarization encoding and effective use with the present invention. The information can be encoded into the polarization of the DMS cluster. To transmit information to the DMS cluster, a spin wave bus-based device is used.

In FIG. 8A, a single DMS cluster 810 that includes three memory cells 812-816 is shown. This memory cell includes a DMS layer 820, p-doped layer 822, and the gate electrode 824 to control hole concentration in the cluster. The memory cells are placed on top of the ferromagnetic film 130 that forms the spin wave bus. Two edge spin-FETs can be used as input/output port 832 and input/output port 834 in either spin wave excitation or detection. FIG. 8B is a graph illustrating the variation in magnetization for increasing voltage.

The advantage of this scheme is in the ability to control the coupling between the cells and ferromagnetic layer by gate voltages (injecting holes). A spin-based Cellular Nonlinear Network, where each cell consists of one DMS cluster, and the interaction between the clusters is via the spin wave bus can also be constructed (see FIG. 8C). The logic state of a cell can be attributed to the cluster spin polarization. The dynamics of the network can be expressed as follows:

$$\frac{d\vec{s}_i}{dt} = J(V_{gi}) \cdot \vec{s}_i \times \left[\vec{H}_{\it eff} + \alpha \vec{s}_i \times \vec{H}_{\it eff}\right] \qquad (9)$$

where $\vec{s}_i$ is the spin operator of the i-th DMS cluster, $J(V_{gi})$ is the coupling parameter which is a function of the gate voltage, and $\vec{H}_{\it eff}$ is the effective magnetic field produced by the superposition of spin waves in the ferromagnetic layer.

ADVANTAGES

Nano-scale computer architectures with a spin wave bus create considerable advantages. Interconnect problems are resolved because there are no physical wires for local interconnections and coupling is achieved via the common ferromagnetic spin wave bus. The coupling occurs via the magnetic field produced by the spin waves. Scalability beyond the conventional CMOS technology occurs because the size of the elementary logic circuit is limited only by the size of the I/O contacts, which are plentiful. These novel architectures are also compatible with CMOS fabrication. The layered structure of the novel devices 100, 200 can be easily realized with high accuracy by film deposition (MBE growth).

In addition, the novel nano-scale computer architectures with a spin wave bus have an enhanced logic functionality, which provides a significant increase in the sphere of cells interactions. Each elementary circuit can be connected with a number of others in the network by spin waves. The sphere of interactions is limited by the spin wave attenuation length. Finally, these architectures have a defect tolerance. The operation is based on the spin wave excitation and spin wave superposition detection. The architectures are inherently tolerable to the imperfections where characteristic size is less than the spin wave coherence length $l_r$. In turn, the coherence length $l_r$ can be artificially controlled by the excitation in the wide range from tens of nanometers to microns.

Figure 9:
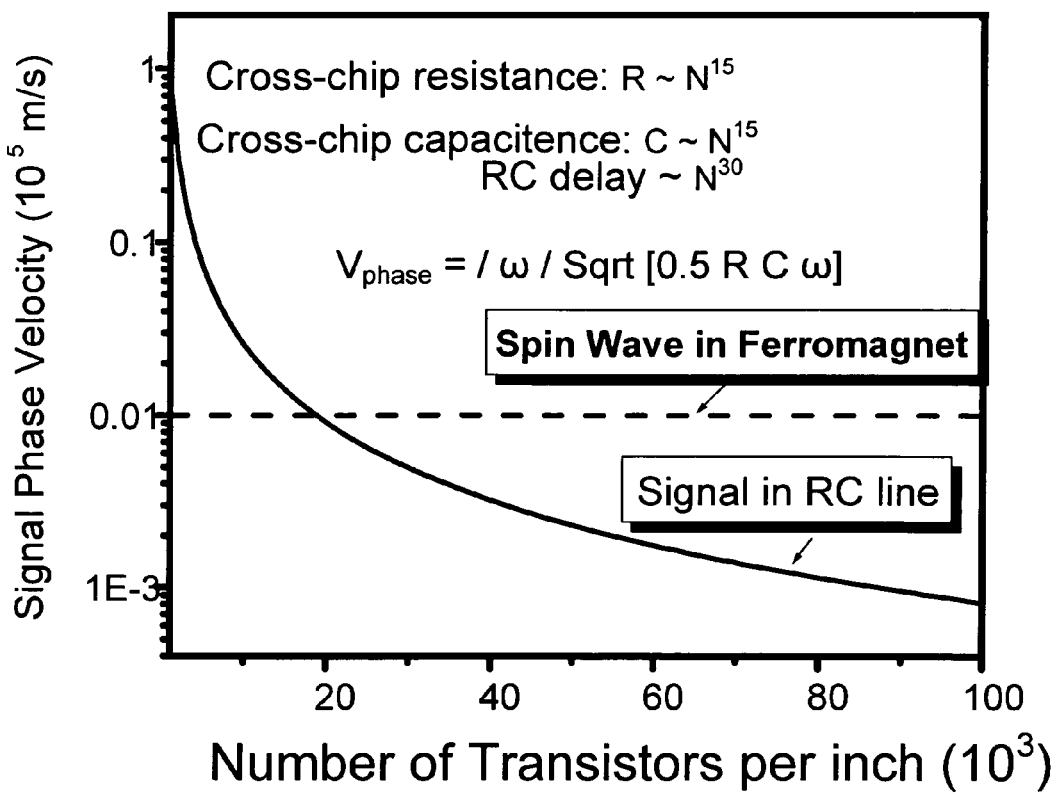
FIG. 9 illustrates a comparison of the cross-chip signal propagation speed and cross-chip signal attenuation in a conventional chip (estimated by the RC line model) with analog propagation speed and signal attenuation for a spin wave in ferromagnetic layer (NiFe).
Figure 9:
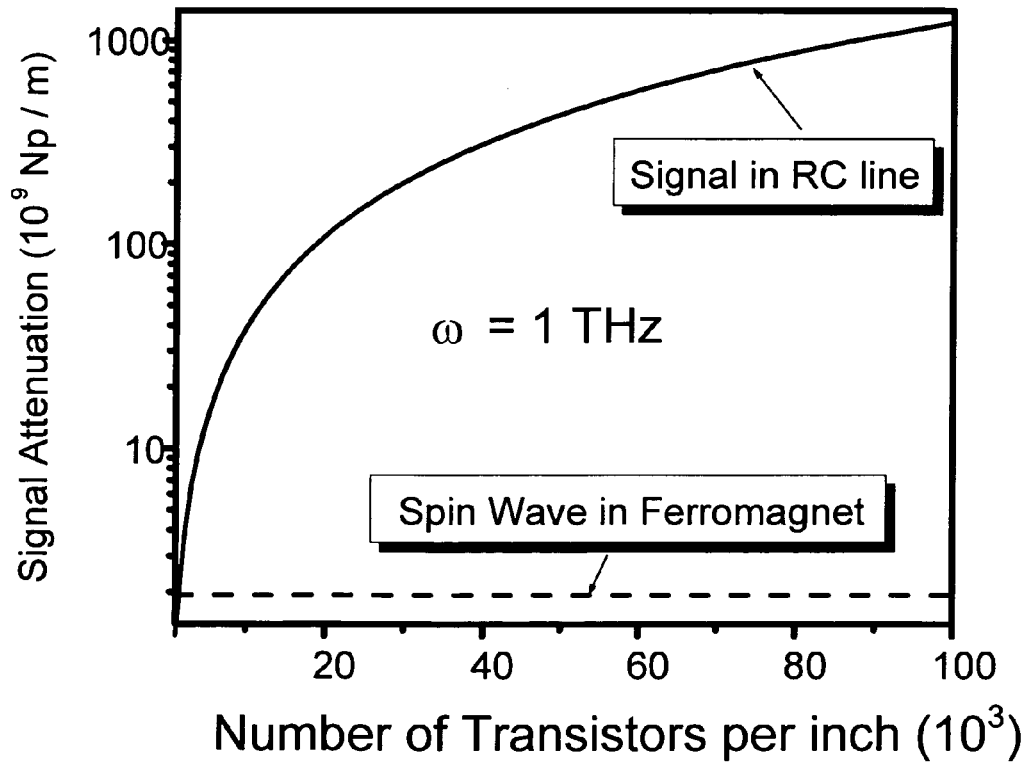

In FIG. 9, the cross-chip signal propagation speed and cross-chip signal attenuation in conventional chip (estimated by the RC line model) with analog propagation speed and signal attenuation for a spin wave in ferromagnetic layer (NiFe) is compared. The calculations are carried out for 1 THz electrical signal and spin wave of the same frequency. The cross-chip signal propagation is plotted as a function of transistors per length density. With transistor size scaled by a factor k, interconnect needs to be scaled ($\alpha$k) to improve packing density (cost-per-gate), and cross-sectional area scales down as $k_2$. According to historical trend, the cross-system resistance increases as $1/k_{1.5}$, and the cross-chip capacitance increases also as $1/k_{1.5}$, so that the RC delay increases as $1/k_3$. The reference point is taken for 100 nm CMOS, RC=3 ps. The spin wave phase velocity is 105 cm/s and the signal attenuation is 109 Np/m. As illustrated in the graphs in FIG. 9, future increase of the chip integration density will inevitably result in signal propagation time increase and substantial signal losses at higher levels much higher than associated with spin waves. As a physical mechanism for information transition, spin waves can compete with the conventional charge-transfer approach at the ultra-high chip density—more than 1010 devices per square inch.

New kinds of nano-scale computational architectures using spin waves as a physical mechanism for device interconnection are described. Information is encoded into the phase of spin waves propagating in a ferromagnetic film-spin wave bus. Using the invented device, several logic devices can be realized. Therefore, information transmission occurs without charge transfer. Architectures using the Spin Wave Bus can be beneficial in reducing power consumption and resolving adverse effects associated with conventional interconnects. In addition, the invented system provides the enhanced logic functionality. Phase logic facilitates realizing a number of logic functions in a single device. Together, these advantages make the nano-scale computer architectures with invented spin wave bus particularly useful in ultra-high-density integrated circuits (i.e., circuits with more than 1010 devices per square inch).

The particular embodiments disclosed above are illustrative only, as the invention can be modified and practiced in different, but equivalent, manners apparent to those skilled in the art having the benefit of the teachings herein. Furthermore, no limitations are intended to the details of construction or design herein shown. It is therefore evident that the particular embodiments disclosed above can be modified and all such variations are considered within the scope and spirit of the invention.

The invention claimed is:

1. A method for operating a logic device having a spin wave bus, comprising the steps of:
   receiving an input signal representing information, wherein the input signal is received via first and second parallel input transmission lines and wherein the first and second input transmission lines function as input devices;
   exciting a spin wave with the information coded in an aspect of the spin wave in response to receiving the input signal;
   propagating the spin wave through a spin wave bus having an associated polarization; and
   determining the information associated with the spin wave in response to propagating the spin wave through the spin wave bus.

2. The method of claim 1, wherein exciting spin wave with the information coded in an aspect comprises coding the information in the phase of the input signal.

3. The method of claim 1, further comprising the steps of:
   generating a propagating wave in response to propagating the spin wave through the spin wave bus;
   altering a phase associated with the propagating spin wave, wherein additional information is coded in the phase of the propagating wave; and
   determining information associated with the propagating wave.

4. The method of claim 1, further comprising exciting a second spin wave with additional information coded in an aspect of the second spin wave in response to receiving a second input signal, and propagating the second spin wave through the spin wave bus.

5. The method of claim 4, further comprising the steps of:
   superposing the first spin wave and the second spin wave to produce a superposed spin wave; and
   determining information associated with the superposed spin wave.

6. The method of claim 1, wherein determining the information associated with the spin wave comprises measuring a change in magnetization associated with the spin wave.

7. A logic device electrically coupled to a voltage source and a detector, the logic device comprising:
   semi-isolating substrate layer;
   a ferromagnetic film layer having a side adjacent to the semi-isolating layer; an insulating layer having a first side adjacent the ferromagnetic layer; and
   at least one transmission line adjacent to and extending across the insulating layer, the transmission line is operative for producing a spin wave that propagates through the ferromagnetic film layer,
   wherein the detector is operative for measuring an inductive voltage associated with the spin wave, and
   wherein the logic device is a logic gate selected from the group of logic gates consisting of a two-bit AND gate, two-bit OR gate, and a two-bit NOT gates.

8. The logic device of claim 7, wherein the at least one transmission line functions as an output device.

9. The logic device of claim 8, further comprising first and second input transmission lines, each of the first and second input transmission lines positioned parallel to the at least one transmission line,
   wherein the first and second input transmission lines function as input devices.

10. The logic device of claim 7, further comprising a plurality of parallel transmission lines placed above the ferromagnetic film,
    wherein each of the plurality of transmission lines is adjacent to the insulator layer and is operative as a one bit input/output port.

11. The logic device of claim 10, wherein the logic device is operative for implementing majority logic.

12. The logic device of claim 10, wherein the insulating layer is composed of silicon dioxide, and the semi-isolating layer is composed of silicon.

13. The logic device of claim 7, wherein the ferromagnetic film layer formed of a composition is selected from the group consisting of nickel iron, iron disilicide, other metal silicides, semiconductor materials, and anti-ferromagnetic materials.

14. A logic device electrically coupled to a voltage source and a detector, the logic device comprising:
    a semi-isolating substrate layer;
    a first transistor having a common terminal, first and second contacts,
    wherein the first and second contacts are individually coupled to the semi-isolating substrate layer;
    an insulating layer having a first side adjacent to the first and second contacts, and a second side is adjacent to the common terminal,
    wherein the common terminal is composed of a ferromagnetic film layer, and the logic device is operative for measuring an inductive voltage associated with a spin wave that propagates through the ferromagnetic layer.

15. The logic device of claim 14, further comprising a plurality of parallel transistors positioned parallel to the first transistor,
    wherein each of the plurality of parallel transistors includes the common terminal.

16. The logic device of claim 15, wherein the logic device is operative for implementing majority logic.

17. The logic device of claim 15, further comprising a plurality of diluted magnetic semiconductors.

18. The logic device of claim 14, wherein the transistors are field effect transistors.

19. The logic device of claim 14, wherein the ferromagnetic film layer formed of a composition is selected from the group consisting of nickel iron, iron disilicide, and other metal silicides.

* * * * *